United States Patent [19]
Saida et al.

[11] Patent Number: 5,437,914
[45] Date of Patent: Aug. 1, 1995

[54] COPPER-CLAD LAMINATE AND PRINTED WIRING BOARD

[75] Inventors: Muneo Saida, Tokyo; Yutaka Hirasawa, Okegawa; Katsuhiro Yoshimura, Oomiya, all of Japan

[73] Assignee: Mitsui Mining & Smelting Co., Ltd., Nihombashi-Muromachi, Japan

[21] Appl. No.: 143,849

[22] Filed: Oct. 26, 1993

[30] Foreign Application Priority Data

Mar. 19, 1993 [JP] Japan .................... 5-085765

[51] Int. Cl.⁶ ................................ B32B 9/00
[52] U.S. Cl. ................................ 428/209; 428/343; 428/344; 428/901; 216/20
[58] Field of Search ........... 428/209, 343, 344, 901; 156/656

[56] References Cited

U.S. PATENT DOCUMENTS

| | | | |
|---|---|---|---|
| 3,171,756 | 3/1965 | Marshall | 428/209 |
| 3,771,973 | 11/1973 | Miller | 428/416 |
| 3,984,598 | 10/1976 | Sarazin et al. | 428/209 |
| 4,191,800 | 3/1980 | Holtzman | 428/251 |
| 4,886,699 | 12/1989 | Carroll et al. | 428/256 |
| 4,997,516 | 3/1991 | Adler | 156/630 |

FOREIGN PATENT DOCUMENTS 0250195  12/1987  European Pat. Off. .
0460856  12/1991  European Pat. Off. .
8502870  7/1985  WIPO .

OTHER PUBLICATIONS

Patent Abstracts of Japan, vol. 017, No. 415 (E-1407) Aug. 3, 1993 & JP-A-05 082 590 (Mitsui Mining & Smelting Co) Apr. 2, 1993.

*Primary Examiner*—Patrick J. Ryan
*Assistant Examiner*—Kam F. Lee
*Attorney, Agent, or Firm*—Bucknam and Archer

[57] ABSTRACT

The present invention provides a copper-clad laminate characterized in that an electrolytic copper foil on the glossy surface side of which a copper electrodeposit is formed, is bonded at its glossy surface side to one side or each of both sides of a substrate, which has a fine-pitch wiring (circuit) pattern and exhibits a high etching factor. The present invention further provides a copper-clad laminate which can be suitably employed in the production of such a printed wiring board.

6 Claims, 3 Drawing Sheets

COPPER-CLAD LAMINATE AND PRINTED WIRING BOARD

BACKGROUND OF THE INVENTION

1. Field of the Invention

The present invention relates to a copper-clad laminate and a printed wiring board. More particularly, the present invention relates to a printed wiring board having a fine-pitch wiring (circuit) pattern and exhibiting a high etching factor, and further relates to a copper-clad laminate which can be suitably employed in the production of such a printed wiring board.

2. Prior Art

The copper-clad laminate for use in the production of a printed wiring board is mainly obtained by bonding a copper loll as a conductive layer to one side or each of both sides of a substrate made from a glass-reinforced epoxy resin material or the like. This copper foil forms a wiring pattern by etching, etc. The copper foil and the substrate are bonded together under pressure while heating with or without an adhesive Interposed therebetween.

As such a copper foil, an electrolytically produced copper foil is generally employed. The electrolytic copper foil is obtained by separating a copper foil deposited on a drum. One side (glossy surface) of the electrolyte copper foil which has been detached from the drum, on which electrodeposition started, is relatively smooth, while the other side (rough surface) or matte surface of the electrolytic copper foil, on which electrodeposition has ended, is generally rough. In the sectional texture of tile electrolytic copper foil, the texture on the glossy surface side, i.e., the texture in the initial stage of electrodeposition exhibits random orientation and small crystal grains, and with the progress of electrodeposition the crystal texture comes to have greater orientation in the direction of the electrodeposition, with the crystal grain size becoming greater. In the conventional copper-clad laminates, the electrolyte copper foil is bonded on its matte surface side to the substrate for the reasons of greater bonding strength and easier handling. In order to improve the peeling strength from the substrate copper particles of 0.2 to 3.5 μm in diameter are applied to the matte surface of the copper foil.

Formation of a wiring pattern by etching the above-mentioned copper-clad laminate has inevitably been accompanied by the problem that the etching factor becomes small due to the effects of crystal orientation and crystal grain boundary.

The etching factor being small means that sharp edges and desirable etching of the conductor pattern cannot be obtained. An explanatory view of the etching factor is shown in FIG. 1.

When the etching factor is small, the top is narrow and the bottom is broad. Thus, the spacing (gap) between the conductor pattern is reduced, thereby causing a problem that migration is likely to occur. Thus, formation of fine patterns is difficult.

Decreasing the thickness of the copper foil may be mentioned as a measure for obtaining a fine pattern. In this case, the sectional area of the conductor becomes so small that the quantity of available electric current is small. Accordingly, for allowing ample current passage, it is necessary to increase the sectional area of the conductor by performing copper plating on the wiring pattern obtained by the etching. Also, when the copper layer is rendered thin, lead bending occurs in a film carrier having an inner lead, e.g., TAB.

Moreover, in the etching of the above-mentioned conventional copper-clad laminate for fine pattern formation, electrodeposited copper particles remain adherent to the substrate of the printed wiring board at the foot of the conductor pattern formed by etching and the remaining electrodeposited copper particles cause the insulating resistance between conductors to decrease, in extreme cases causing short-circuiting.

Various reports have been published describing the formation of copper electrodeposits on the copper foil. For example, the electrodeposition of a layer of copper particles onto each of both sides of a copper foil has been reported. However, this copper foil is one for use as an inner conductor layer into a multilayer printed wiring board, and the purpose of the electrodeposition is to provide a substitute for the black oxide treatment aiming at ensuring the adhesion of the inner copper foil to the substrate at the secondary bonding. A pattern printing is applied to the glossy surface of the electrolytic copper foil, and the etching is performed from the glossy surface side. In another example, Japanese Patent Application Laid-Open Gazette No. 29740/1993 describes an electrolytic copper foil having both sides thereof provided with gloss plating, with one of the sides of the copper foil having been subjected to surface treatment, such as toughening. In this example, also, the etching is performed from the glossy surface side.

SUMMARY OF THE INVENTION

The present invention has been made to overcome the above problems of the prior art. It is an object of the present invention to provide a printed wiring board which exhibits a high etching factor without suffering from a lowering in peeling strength, and which is free from the adhesion and remaining of copper particles at the foot of the wiring pattern and has a wiring pattern of desirable fine pitch, and to provide a copper-clad laminate for use in the printed wiring board.

The above object of the present invention can be attained by forming a copper electrodeposit on a glossy surface side of an electrolytic copper foil and then bonding the copper foil at the glossy surface side to a substrate.

Thus, according to the present invention, there is provided a copper-clad laminate characterized in that an electrolytic copper foil having a glossy surface on one side and a matte surface on the other side in which a copper deposit is formed on the glossy surface side bonded at its glossy surface side to one side or each of both sides of a substrate. Further, there is provided a printed wiring board produced by using the above described copper-clad laminate.

Hereinbelow, the copper-clad laminate and the printed wiring board according to the present invention will be described in more detail.

FIGS. 2(a) through 2(c) illustrate the steps of a process for producing the copper-clad laminate of the present invention.

As shown in FIG. 2(a), a copper electrodeposit 2 is formed on a glossy surface side 1a of an electrolytic copper foil 1. The height of the copper electrodeposit is desirably in tile range of from 0.2 to 2.0 μm. The copper electrodeposit 2 may assume various forms, such as whiskery, dendritic and nodular forms. The copper electrodeposit 2 is formed by performing electroplating at a high current density at room temperature. As a plating bath for use in such electroplating, there may be mentioned a copper sulfate bath containing 10 to 30 g/l of copper and 50 to 150 g/l of sulfuric acid. Further, a copper plating (not shown) is applied onto the copper electrodeposit 2 under such conditions such that the copper concentration is in the range of from 50 to 80 g/l, the sulfuric acid concentration is in the range of from 50 to 150 g/l and the bath temperature is in the range of from 40° to 50° C., in order to Improve the adhesion of the copper electrodeposit to the copper foil. Still further, an appropriate treatment for corrosion prevention is carried out.

Subsequently, the copper foil 1 is slit to strips having an appropriate width, and then bonded to a substrate 3 on the glossy surface side 1a having the copper electrodeposit 2 formed thereon and further having been subjected to copper plating, as shown in FIG. 2(b). The substrate 3 is not particularly limited. However, it is generally selected from among a substrate of a glass-reinforced epoxy resin, a substrate of a paper-filled phenol resin, a substrate of a polymide resin and a substrate of a polyester resin. The copper foil 1 is bonded to the substrate 3 directly or through all adhesive by pressing at an elevated temperature. Suitable as such an adhesive is, for example, a thermosetting epoxy resin adhesive.

Thus, a copper-clad laminate comprising a substrate 3 and, an electrolyte copper foil 1 laminated thereto is obtained. The electrolytic copper foil 1 has its matte surface 1b exposed. When the matte surface 1b is so irregular as to have a surface roughness (Rz) of from 4 to 12 μm, no resist can be uniformly applied to the matte surface 1b. Therefore, as shown in FIG. 2(c), the matte surface 1b is smoothed by chemical polishing, such as etching, or by physical polishing, such as buffing. In the chemical polishing, for example, an etching solution is employed which comprises cupric chloride, hydrochloric acid and hydrogen peroxide water. It is preferred that the smoothing of the matte surface 1b be performed to a surface roughness (Rz) of less than 4 μm. When the surface roughness is greater than the above value, it is difficult to form a resist pattern having a sharp configuration. On the other hand, when the surface roughness (Rz) of the matte surface 1b of the electrolyte copper foil 1 is less than 4 μm, the above-mentioned smoothing is not necessary.

The foregoing steps provide the copper-clad laminate of the present invention.

From this copper-clad laminate, a printed wiring board having a fine-pitch wiring pattern is produced by applying a resist to the smoothed exposed surface (matte surface) of the electrolytic copper foil and forming a wiring pattern with a pitch of as fine as 150 μm or less by the conventional procedure comprising light exposure, development and etching according to photolithography.

The obtained printed wiring board exhibits a high etching factor, and is free from the adhesion and remaining of copper particles at the foot of the conductor pattern on the substrate formed by etching.

In the copper-clad laminate of the present invention, the electrolytic copper foil is bonded on its glossy surface side to the substrate. The glossy surface side of the copper foil has a random orientation of small crystal grains, while the matte surface side of the copper foil has a texture of large crystals oriented in the direction of the electrodeposition. Hence, when the etching is performed from the matte surface side, the etching proceeds along grain, so that the crystal having large particle size and exhibiting high orientation in the side of the matte surface is less in side etching amount while the glossy surface side (substrate side) having small grain size and exhibiting random orientation is susceptive to side etching. Therefore, the use of such a copper-clad laminate leads to the production of a printed wiring board exhibiting a high etching factor and having a sharply etched fine-pitch wiring pattern. Further, according to the present invention the strength of the wiring pattern can be increased that much because the pattern can be designed so as to allow lines to have a large width and a large height even with the same pitch. Moreover, various types of electrolytic copper foils can be employed. For example, various electrolytic copper foils can be employed, from which a fine-pitch printed wiring board has not been available by the conventional procedure due to large roughness of the matte surface, irrespective of the electrolytic copper foils being excellent in physical properties, such as elongation and flexibility. Still further, the thickness of the electrolytic copper foil can be regulated by performing etching, so that the freedom in circuit designing is increased to thereby ensure, for example, a combination of electric resistance and strength.

As illustrated above, the present invention has the following effects:

(1) a copper-clad laminate excellent in etching properties which ensures a large etching factor value is obtained and it finds wide applications in the fields where fine electric circuits are required;

(2) any wiring pitch as designed is obtained, thus makes impedance control of the substrate possible;

(3) a high-density wiring is easily obtainable, whereby the productivity of a fine pitch printed wiring board is improved; and (4) a fine pitch wiring pattern can be formed from a an electrolytic foil copper foil having a thickness greater than that in the prior art, so that an additional step for plating on the formed wiring pattern to meet a desired current passage is no longer needed.

PREFERRED EMBODIMENTS OF THE INVENTION

Hereinbelow, the present invention will be described in more detail with reference to the following Examples.

Example 1

A granular copper layer was formed by plating on the glossy surface side of an electrolytic copper foil of 35 μm in thickness having surface roughness (Rz) of 1.2 μm and on the glossy surface roughness (Rz) of 2.3 μm. As a result on the matte surface, the roughness (Rz) of the glossy surface side of the copper foil became 2.7 μm.

The plating for electroforming the granular copper layer comprised burnt deposit plating in a sulfuric acid bath having a copper concentration of 12 g/l and a sulfuric acid concentration of 100 g/l at a current density of 30 A/dm$^2$ for 10 seconds, followed by covering plating in a sulfuric acid bath having a copper concentration of 60 g/l and a sulfuric acid concentration of 100 g/l at a current density of 30 A/dm$^2$ for 10 seconds.

The resultant electrolytic copper foil was subjected on both sides to the following treatment for corrosion prevention. The treatment for corrosion prevention comprised plating in a zinc sulfate bath having a zinc concentration of 5 g/l and a sulfuric acid concentration of 50 g/l at a current density of 5 A/dm$^2$ for 8 seconds, followed by immersion if a bath of 10 g/l anhydrous chromic acid for 10 seconds, washing with flowing water for 10 seconds, and drying with hot air.

The obtained electrolytic copper foil having the copper electrodeposit formed on the glossy surface side thereof was bonded under pressure, on the glossy surface side thereof, to one side of a substrate of glass-reinforced epoxy resin FR-4, thereby obtaining a copper-clad laminate.

Thereafter, a dry film (produced by Nichigou Alpha Co., Ltd.) was laminated to the copper-clad laminate, and a pattern was formed by UV exposure through a pattern film with a resist width of 50 μm and a circuit pattern interval of 70 μm. Etching was performed at the etching solution temperature of 50° C. for 50 seconds, using a commercially available etching solution of copper chloride.

Figure 1:
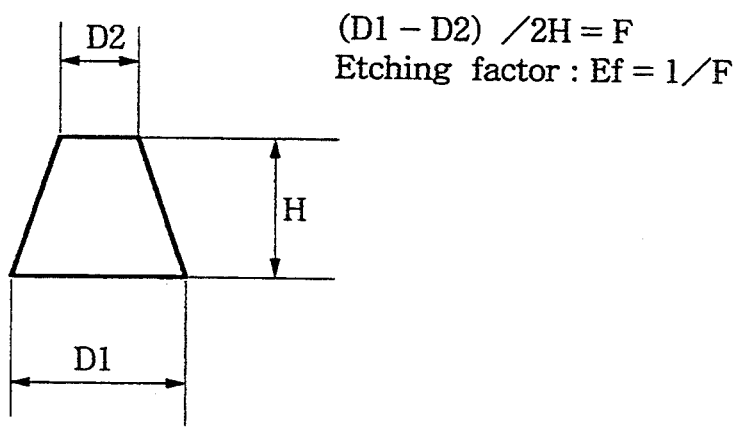
FIG. 1 is an explanatory view of the etching factor for a wiring pattern.
Figure 2A:
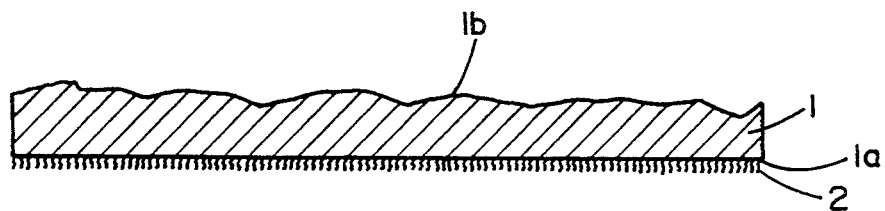
FIGS. 2a, 2b, 2c illustrate the steps for producing a copper-clad laminate according to the present invention.
Figure 2B:
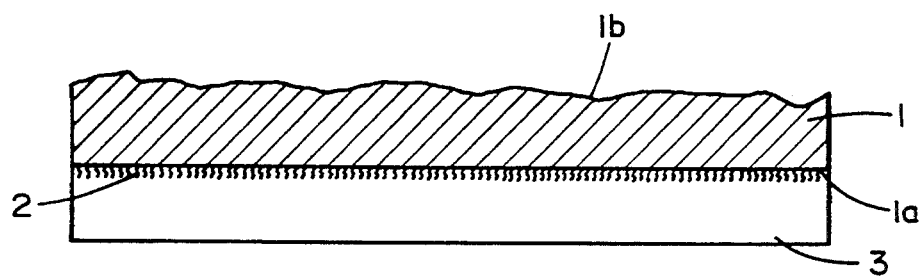
Figure 2C:
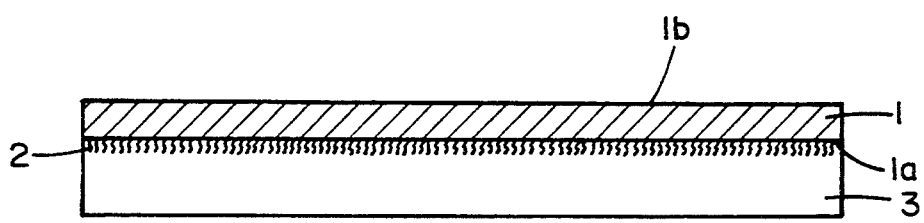
Figure 3:
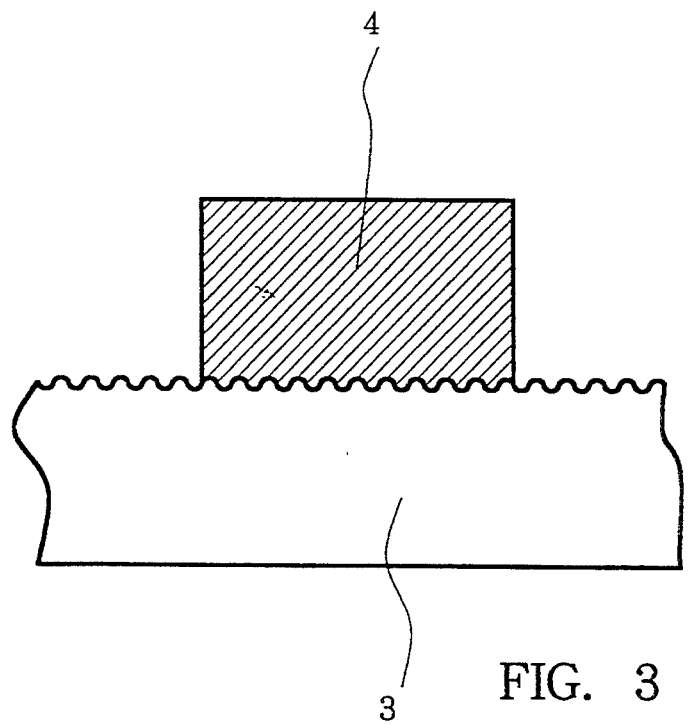
FIG. 3 is a sectional view of a fine-pitch wiring pattern obtained in Example 1.

A wiring pattern sectional view of the obtained printed wiring board is schematically shown in FIG. 3. In the figure, numeral 3 designates a substrate and numeral 4 disignates a fine-pitch wiring (circuit) pattern. In the wiring pattern the top side is 42.2 μm, the bottom side is 49.2 μm and the height is 31.7 μm. Thus, the etching factor is 9.0. There was no adhesion and remaining of copper particles at the foot of the etching pattern on the substrate of the glass-reinforced epoxy resin. The peeling strength after the etching was 1.55 kg/cm.

Example 2

A granular copper layer was electroformed by plating on a glossy surface side of an electrolytic copper foil of 35 μm in thickness having a surface roughness (Rz) of 1.3 μm on the glossy surface and a rough surface roughness (Rz) of 5.4 μm on the matte surface. As a the result, roughness (Rz) of the glossy surface side of the copper foil became 2.9 μm. The plating for electrodepositing the granular copper layer was conducted under the same conditions as in Example 1.

The resultant electrolytic copper foil was subjected on both sides to the treatment for corrosion prevention under the same conditions as in Example 1.

The obtained electrolytic copper foil having the copper electrodeposit formed on the glossy surface side thereof was bonded under pressure, on the glossy surface side thereof, to one side of a substrate of glass-reinforced epoxy resin FR-4 in the same manner as in Example 1, thereby obtaining a copper-clad laminate.

The matte surface side of the copper foil of the copper-clad laminate was buffed with #600 buff (manufactured by Tsunoda Brush Co., Ltd.) under the conditions such that the revolution speed was 500 rpm, the applied pressure was 0.5 kg and the line speed was 3 m/min.

Thereafter, in the same manner as in Example 1, a pattern was formed by UV exposure through a pattern film with a resist width of 50 μm and a pattern interval of 70 μm, followed by etching, thereby obtaining a printed wiring board.

A wiring pattern of the obtained printed wiring board had a top side of 41.7 μm, a bottom side of 49.2 μm and a height of 30.8 μm. Thus, the etching factor was 8.4. There was no adhesion and remaining of copper particles at the foot of the etching pattern on the substrate of the glass-reinforced epoxy resin. The peeling strength after the etching was 1.49 kg/cm.

Comparative Example 1

Using the same electrolytic copper foil as in Example 1, a granular copper layer was electrodeposited by plating on the matte surface side of the electrolytic copper foil. As a result, the roughness (Rz) of the matte surface side of the copper foil became 4.2 μm. The plating for elctrodepositing the granular copper layer was conducted under the same conditions as in Example 1.

The obtained electrolytic copper foil having the copper electrodeposit formed on the matte surface side thereof was bonded under pressure, on the matte surface side thereof, to one side of a substrate of glass-reinforced epoxy resin FR-4 in the same manner as in Example 1, thereby obtaining a copper-clad laminate.

Thereafter, in the same manner as in Example 1, a pattern was formed by UV exposure through a pattern film with a resist width of 50 μm and a pattern interval of 70 μm, followed by etching, thereby obtaining a printed wiring board.

A wiring pattern of the obtained printed wiring board had a top side of 40.3 μm, a bottom side of 56.3 μm and a height of 32.0 μm. Thus, the etching factor was 4.0. The peeling strength after the etching was 1.71 kg/cm.

Comparative Example 2

Using the same electrolytic copper foil as in Example 2, a granular copper layer was electrodeposited by plating on the matte surface side of the electrolytic copper foil. As a result, the roughness (Rz) of the matte surface side of the copper foil became 6.7 μm. The plating for electrodepositing the granular copper layer was conducted under the same conditions as in Example 1.

The obtained electrolytic copper foil having the copper electrodeposit formed on the matte surface side thereof was bonded under pressure, on the matte surface side thereof, to one side of a substrate of glass-reinforced epoxy resin FR-4 in the same manner as in Example 1, thereby obtaining a copper-clad laminate.

Thereafter, in the same manner as in Example 1, a pattern was formed by UV exposure through a pattern film with a resist width of 50 μm and a pattern interval of 70 μm, followed by etching, thereby obtaining a printed wiring board.

Figure 4:
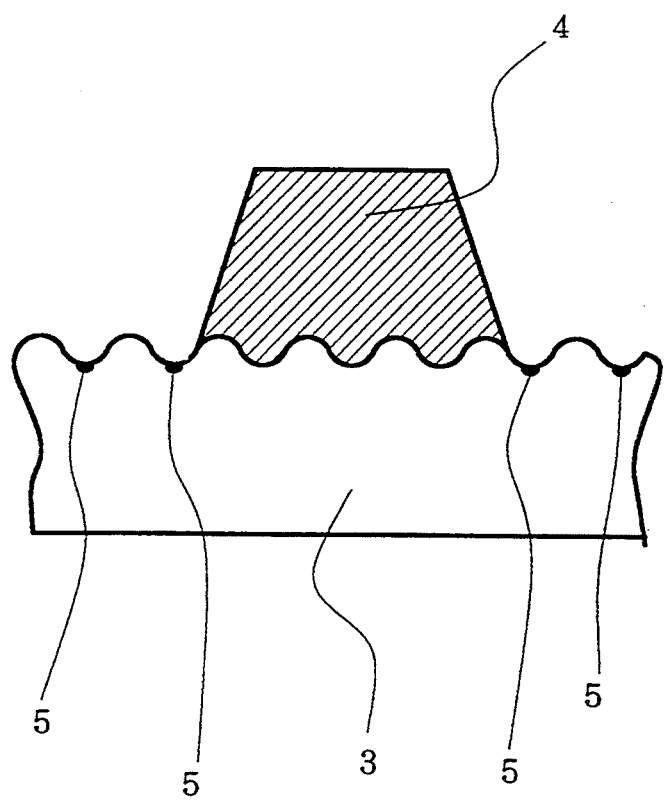
FIG. 4 is a sectional view of a fine-pitch wiring pattern obtained in Comparative Example 2.

A wiring pattern sectional view of the obtained printed wiring board is schematically shown in FIG. 4. In the wiring pattern, the top side is 37.2 μm, the bottom side is 66.3 μm and the height is 35.0 μm. Thus, the etching factor is 2.4. There was an adhesion and remaining of copper particles, as indicated by numeral 5, at the foot of the etching pattern of the substrate of the glass-reinforced epoxy resin. The peeling strength after the etching was 2.18 kg/cm.

What is claimed is:

1. A copper clad laminate which consists essentially of an electrolytic copper foil (1) and a substrate (3), said substrate (3) having two sides, said electrolytic copper foil (1) having a glossy surface side (1a) and a matte surface side (1b), a granular copper layer (2) being electrodeposited on said glossy surface side (1a), said glossy surface side (1a) being bonded through said granular copper layer (2) to at least one side of said substrate (3).

2. A printed wiring board prepared by etching said copper clad laminate according to claim 1 in the direction from said matte surface towards said glossy surface.

3. The laminate according to claim 1 wherein said granular copper layer is electrodeposited to a height of 0.2–2.0 μm.

4. The laminate according to claim 1 wherein said substrate is made from a glass-reinforced epoxy resin, a paper filled phenol resin, a polyamide resin or a polyester resin.

5. The laminate according to claim 1 wherein said matte surface has roughness Rz less than 4 μm.

6. The printed wiring board according to claim 2 which is produced by applying a resist to said matte surface and said printed wiring board has a fine pitch wiring pattern of up to 150 μm.

* * * * *